(12) United States Patent
Park et al.

(10) Patent No.: US 11,029,205 B2
(45) Date of Patent: Jun. 8, 2021

(54) INTEGRATED CIRCUIT COMPRISING MULTIPLE CHANNELS WITH INTEGRATED BYPASS CAPACITORS AND PHOTODIODES

(71) Applicant: Intel Corporation, Santa Clara, CA (US)

(72) Inventors: Sungbong Park, Santa Clara, CA (US); Ansheng Liu, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 34 days.

(21) Appl. No.: 16/513,457

(22) Filed: Jul. 16, 2019

(65) Prior Publication Data

US 2019/0339122 A1    Nov. 7, 2019

(51) Int. Cl.
| | |
|---|---|
| *G01J 1/46* | (2006.01) |
| *H01L 27/06* | (2006.01) |
| *H01L 49/02* | (2006.01) |
| *G01J 1/44* | (2006.01) |

(52) U.S. Cl.
CPC ............ *G01J 1/46* (2013.01); *H01L 27/0629* (2013.01); *H01L 28/40* (2013.01); *G01J 2001/4466* (2013.01)

(58) Field of Classification Search
CPC ........ G01J 1/46; H01L 27/0629; H01L 28/40; H01L 27/14643; H01L 31/0352; H01L 31/0376; H01L 31/102; H01L 31/075; H01L 27/1463; H01L 27/14614; H01L 27/1464; H01L 27/14683; H01L 27/14806; H01L 27/14638; H01L 27/14689; H01L 27/14621; H01L 27/14627; H04B 10/6932; H04B 10/6911; H04B 10/40; G02B 6/4201; H04N 1/1931; H04N 5/3559
USPC ...................... 398/202, 14; 257/225; 438/60
See application file for complete search history.

(56) References Cited

U.S. PATENT DOCUMENTS

| | | | |
|---|---|---|---|
| 6,643,472 B1 * | 11/2003 | Sakamoto | H04B 10/66 250/214 R |
| 2003/0081297 A1 * | 5/2003 | Hasegawa | H04B 10/6932 398/202 |
| 2004/0159776 A1 * | 8/2004 | Richard | H03K 19/00369 250/214 R |
| 2016/0035784 A9 * | 2/2016 | Kim | H01L 27/1463 250/208.1 |

(Continued)

*Primary Examiner* — Mouloucoulaye Inoussa
(74) *Attorney, Agent, or Firm* — Schwabe, Williamson & Wyatt, P.C.

(57) ABSTRACT

Embodiments described herein relate to techniques and configurations associated with a photonic apparatus (e.g., PIC) having a photodiode and a bypass capacitor disposed in a channel. In one instance, the apparatus includes a substrate in which at least first and second channels are formed. The first channel includes a first photodiode and a first capacitor coupled to the first photodiode, and the second channel includes a second photodiode and a second capacitor coupled with the second photodiode. The first and second capacitors are provided to assist with biasing the first and second photodiodes respectively and to isolate a signal output by the first and second photodiodes from interference provided by the power supply associated with the apparatus. Additional embodiments can be described and claimed.

17 Claims, 5 Drawing Sheets

(56) References Cited

U.S. PATENT DOCUMENTS

2018/0233528 A1* 8/2018 Na ..................... H01L 31/075
2018/0316441 A1* 11/2018 Yagisawa ............... H04B 10/40

* cited by examiner

INTEGRATED CIRCUIT COMPRISING MULTIPLE CHANNELS WITH INTEGRATED BYPASS CAPACITORS AND PHOTODIODES

FIELD

Embodiments described herein generally relate to the field of optoelectronics. More particularly, but not exclusively, embodiments described herein relate to techniques and configurations associated with integrating bypass capacitors and photodiodes into a photonic integrated circuit (PIC) comprising multiple channels.

BACKGROUND

A photodiode (e.g., an avalanche photodiode (APD), a PIN photodiode, etc.) is a semiconductor device that converts light (optical power) impinging on the photodiode into a current. A photodiode may be integrated into an integrated circuit (IC), such as a photonic integrated circuit (PIC), which may be a part of a photonic device.

A photonic device can include a photodiode and an amplifier (e.g., a trans-impedance amplifier (TIA), etc.). In this type of photonic device, the amplifier amplifies an output of the photodiode, converting a current output by the photodiode into a voltage. Following the conversion, one or more voltage regulators in the amplifier maintain the voltage at a constant level. In some instances, the photodiode can convert received high intensity optical power into a current that exceeds a threshold current that can be handled by the amplifier. In this scenario, the amplifier can overload when it processes the photodiode's output current. The amplifier's inability to handle current that exceeds a certain threshold may limit the performance of the photonic device. The photodiode's performance may be also dependent on the photonic device's temperature.

BRIEF DESCRIPTION OF THE DRAWINGS

Embodiments can be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe techniques and configurations for a photonic apparatus having photodiodes with bypass capacitors integrated in a multi-channel photodiode array. In embodiments, the apparatus (e.g., a PIC) includes a substrate in which at least first and second optical channels are formed. The first channel includes a first photodiode and a first capacitor coupled to the first photodiode; and the second channel includes a second photodiode and a second capacitor coupled with the second photodiode. The first and second capacitors are provided to assist with biasing the first and second photodiodes respectively and to isolate a signal output by the first and second photodiodes from interference provided by the power supply associated with the apparatus. In embodiments, the apparatus also includes a temperature sensor (e.g., a temperature sensing diode (e.g., a PN diode, a PIN diode, etc.)) to sense the PIC's temperature and to provide the temperature readings to another apparatus coupled with the apparatus for processing, including dynamic bias adjustment for the photodiodes of the apparatus. In embodiments, the temperature sensor may be included as part of the PIC, or may be located adjacent the PIC.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As noted above, a photonic device performance depends on the current and temperature. For example, a gain (e.g., direct current (DC) or noise gain, etc.) and a bandwidth associated with the photodiode are strongly dependent on the photonic device's temperature. Furthermore, the PIC's temperature is proportional to the current in the PIC. For example, as the current produced by the photodiode increases, the PIC's temperature increases. Thus, excessive levels of current or temperature can negatively affect the gain and bandwidth associated with the photodiode.

One way to address excessive levels of current or temperature is to prevent the current or temperature from reaching undesirable levels. In some conventional solutions, this may be achieved by coupling a variable optical attenuator (VOA) to the photodiode. The VOA's function is to attenuate optical power received by the photodiode. In this way, the current produced by the photodiode and provided to the amplifier is maintained below a threshold current, which assists with preventing the amplifier from overloading and with maintaining the photonic device's temperature below a threshold temperature. However, the VOA can take up valuable real estate in the PIC and limit the gain and bandwidth associated with the photodiode.

In some conventional solutions, the magnitude of the voltage used to bias the photodiode can be varied in order to keep the photodiode's gain and bandwidth at acceptable levels. This can be achieved through use of an external biasing source (e.g., biasing circuitry, etc.) to bias the photodiode. The external biasing source's output, however, may be marred with noise. Furthermore, the output of the photonic device's power supply may interfere with the photodiode's output current. In some solutions, a surface mount technology (SMT) capacitor can be integrated into the photonic device, to assist with biasing the photodiode by filtering some or all the noise in the external biasing source's output, and to isolate the photodiode's output current from the output of the photonic device's power source.

In some instances, integration of an SMT capacitor into the photonic device may be challenging when the photonic device comprises multiple optical channels. This is because the channel-to-channel pitch may be limited by a size of the pitch between the adjacent amplifiers on the photonic device. That is, the channel-to-channel pitch is at least equal to a size of the pitch between the adjacent amplifiers on the photonic device. Typically, the size of the pitch between adjacent amplifiers on the photonic device is relatively smaller than the size (e.g., width, length, etc.) of an SMT capacitor. For example, the pitch may be 250 microns (μm) or less, while the SMT capacitor may have a size (e.g., width, length, etc.) that is at least 2 mm. Consequently, the channel-to-channel pitch can typically be smaller than the size of the SMT capacitor. The relatively large size of the SMT capacitor can prevent the SMT capacitor from being disposed in a channel that must comply with the channel-to-channel pitch described above.

The SMT capacitor can be disposed on the photonic device at a location that differs from the location of the channels. However, in this scenario, when placed at a different location, the SMT capacitor can increase the size of a photonic device or take up valuable real estate on a size-limited photonic device. Each of these outcomes is undesirable because of rising pressures to miniaturize photonic devices and increase the number of components that fit on or in photonic devices. Furthermore, because the SMT capacitor's location differs from the channels' location, traces that couple the SMT capacitor to a photodiode or a ground pad of the photonic device may be undesirably long. Signals communicated via these long traces can become degraded.

In the following description, numerous specific details are set forth, such as specific material and structural regimes, in order to provide a thorough understanding of embodiments of the present disclosure. It will be apparent to one skilled in the art that embodiments of the present disclosure may be practiced without these specific details. In other instances, well-known features are not described in detail in order to not unnecessarily obscure embodiments of the present disclosure. Furthermore, it is to be understood that the various embodiments shown in the Figures are illustrative representations and are not necessarily drawn to scale. In some cases, various operations can be described as multiple discrete operations, in turn, in a manner that is most helpful in understanding the present disclosure; however, the order of description should not be construed to imply that these operations are necessarily order dependent. In particular, these operations need not be performed in the order of presentation.

Figure 1:
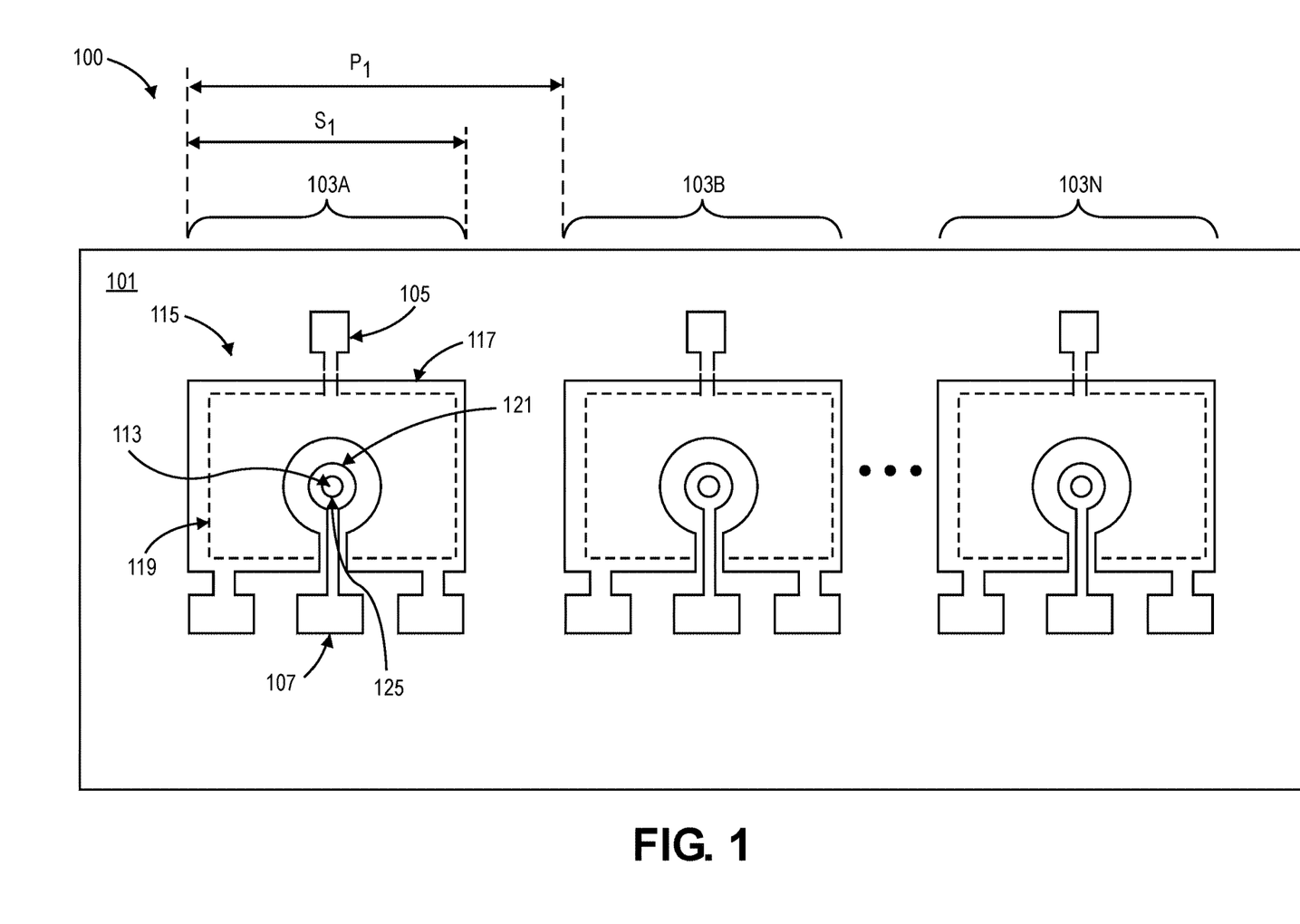
FIG. 1 is a diagram of an example photonic device with photodiodes and bypass capacitors integrated in respective channels, in accordance with some embodiments.

FIG. 1 is a diagram illustrating an example photonic device with photodiodes and bypass capacitors integrated in respective channels, in accordance with some embodiments. More specifically, FIG. 1 shows a PIC 100 characterized by multiple channels 103A-103N, where a bypass capacitor 115 and a photodiode 113 are disposed in each of the multiple channels 103A-103N. As shown, the PIC 100 can include any number of channels 103A-103N, which in turn means the PIC 100 can include any number of bypass capacitors 115 and photodiodes 113. For brevity, the description provided below in connection with FIG. 1 may sometimes focus on the channel 103A. It is to be appreciated that such description is applicable to each of channels 103B-103N. In embodiments, a PIC that has bypass capacitors and photodiodes integrated thereon may be included in a photonic apparatus, such as an optical receiver.

In embodiments, each bypass capacitor can be fabricated, for example, by disposing a dielectric layer (e.g., a layer formed from a high k dielectric material, etc.) between two electrically conductive layers (e.g., layers from conductive metals or combinations of conductive metals, etc.). In embodiments, the photodiodes may comprise APD or PIN diodes.

In embodiments, the PIC 100 includes a substrate 101. The substrate 101 may be formed from any suitable material or combination of materials known in the art (e.g., silicon, etc.). In embodiments, the substrate 101 comprises channels 103A-103N formed in the substrate 101. In embodiments, each channel 103A-103N can be coupled to a channel on an IC (not shown in FIG. 1 and described below in reference to FIG. 4) such that the resulting channel spans the PIC and the IC (not shown). As used herein, the resulting channel that is formed when two channels on separate ICs are coupled to each other is referred to as a data channel.

In embodiments, a channel-to-channel pitch $P_1$ between adjacent channels selected from the channels 103A-103N is constrained by a channel-to-channel pitch between adjacent channels on an IC (not shown) that is different from the PIC 100. More specifically, the channel-to-channel pitch $P_1$ is equal to the channel-to-channel pitch of the IC. As shown, each of the channels 103A-103B includes a bypass capacitor 115 and a photodiode 113. In embodiments, each bypass capacitor 115 and each photodiode 113 can have a size (e.g., width, length, etc.) that is less than the respective one of the channels 103A-103B that includes the bypass capacitor 115 and the photodiode 113.

In embodiments, the PIC 100 includes a photodiode 113 that comprises a cathode 105 and an anode 107. The cathode 105 may be coupled to biasing circuitry (not shown). In embodiments, the cathode 105 receives signals from the biasing circuitry (not shown) for biasing the photodiode 113. The anode 107 may be coupled to an external component that is not included as part of the PIC 100 (described in reference to FIG. 2), such as an amplifier. In embodiments, the anode 107 communicates an output (e.g., one or more current signals, etc.) to the external component for further processing. In embodiments, each of the cathode 105 and the anode 107 is part of an electrically conductive layer 119. A ground reference plane 117 is positioned above the layer 119. Each of the layers 117 and 119 may be formed from any suitable electrically conductive metal (e.g., copper, aluminum, etc.) or combination of suitable electrically conductive metals.

As shown in FIG. 1, each of the electrically conductive layer 119 and the ground reference plane 117 includes an opening 121. In embodiments, the opening 121 isolates the anode 107 from other components or features on the substrate 101. As shown in FIG. 1, the anode 107 includes an opening 125. In embodiments, the opening 125 exposes the photodiode 113 so that light (optical power) can be impinged on the photodiode 113. Additional details about the photodiode 113 are described below in connection with one or more of FIGS. 2-3B.

The bypass capacitor 115 may include the electrically conductive layer 119 and the ground reference plane 117. More specifically, the bypass capacitor 115 includes a dielectric layer (not visible in FIG. 1) disposed between the electrically conductive layer 119 and the ground reference plane 117. In embodiments, the bypass capacitor 115 comprises a Metal-Insulator-Metal Capacitor (MIMCAP). A MIMCAP is suitable for use as the bypass capacitor 115 because a MIMCAP can be formed using readily available materials (e.g., the electrically conductive layer 119, the ground reference plane 117, and a dielectric material, etc.) via application of state-of-the-art manufacturing processes. Furthermore, the size (e.g., width, length, etc.) of MIMCAP can be designed to conform to a particular configuration based on design constraints. For example, the size of the MIMCAP can be designed to less than or equal to a size $S_1$ of the channel 103A, so that the MIMCAP fits into the channel 103A. The channel size $S_1$ of the PIC 100 is determined with reference to a channel-to-channel pitch $P_1$ for the channels 103A-103N. Designing the MIMCAP that complies with the channel-to-channel pitch $P_1$ and the size $S_1$ obviates the need to use SMT capacitors.

Another advantage of using a MIMCAP as the bypass capacitor 115 is that the MIMCAP can be designed to have a specified capacitance (e.g., 1 picofarad (pF), 100 pF, any other suitable capacitance). In embodiments, when the bypass capacitor 115 is a MIMCAP, it can have a capacitance of 100 pF.

The bypass capacitor 115 can assist with biasing the photodiode 113. This is because the bypass capacitor 115 supports relatively higher biasing voltages (e.g., 10 volts (V) or higher, etc.) than the conventionally used amplifiers (e.g., TIAs, etc.). Consequently, the bypass capacitor 115 assists with minimizing or eliminating the use of amplifiers that are limited in their capability to bias the photodiode 113. Additionally, the bypass capacitor 115 can assist with isolating the current output of the photodiode 113 from noise or interference that is attributable to a biasing source or a power supply of the PIC 100. In this way, the bypass capacitor 115 assists with acquiring a high speed output from the photodiode 113. Additional details about the bypass capacitor 115 are described below in connection with one or more of FIGS. 2-3B.

Figure 2:
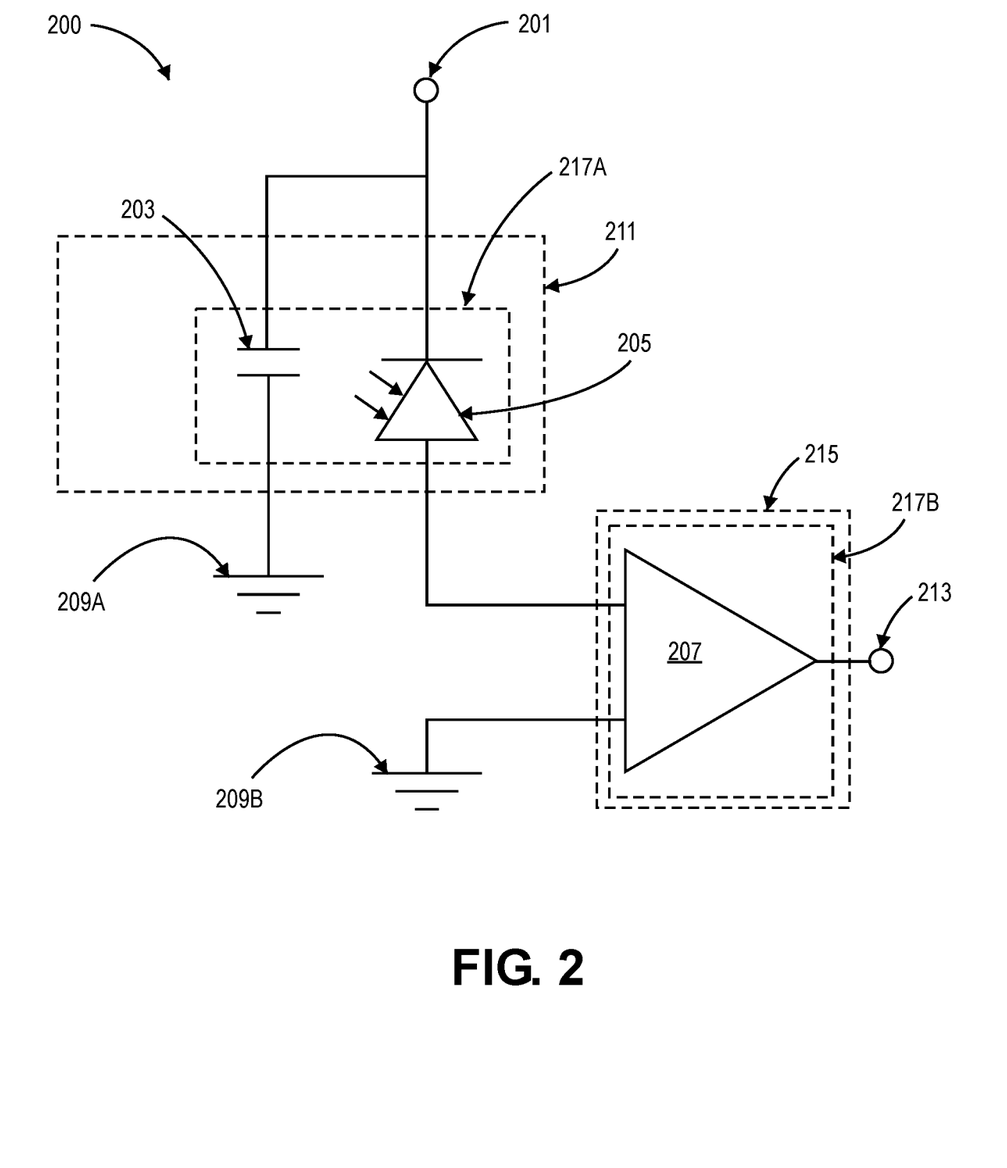
FIG. 2 is a diagram of an example photonic device having a photodiode with a bypass capacitor integrated in a channel, in accordance with some embodiments.

FIG. 2 is a diagram of an example photonic device having a photodiode with a bypass capacitor integrated in a channel, in accordance with some embodiments. In embodiments, the device 200 includes a PIC 211 comprising a bypass capacitor 203 and a photodiode 205 integrated in a channel 217A of the PIC 211. The device further includes an amplifier 207 integrated in a channel 217B of an IC 215, which can be separate and couple with the PIC 211. The device 200 further includes an I/O signal pad 201 to be coupled to biasing circuitry (not shown), an output signal pad 213 to be coupled to an external component (e.g., a post-amplifier, etc.), and ground pads 209A-209B.

In embodiments, the bypass capacitor 203 and the photodiode 205 are disposed in a channel 217A of the PIC 211, while the amplifier 207 is disposed in a channel 217B of the IC 215. In embodiments, the channel 217A is coupled to the channel 217B to form a data channel that spans the PIC 211 and the IC 215 for signal communication.

The bypass capacitor 203 may be similar to or the same as the bypass capacitor 115 described above in connection with FIG. 1. In embodiments, the bypass capacitor 203 comprises a dielectric material (e.g., a high k dielectric material, etc.) disposed between two metallic materials (e.g., copper, aluminum, etc.). The bypass capacitor 203 is coupled to the ground pad 209A, the I/O signal pad 201, and the photodiode 205, to assist with biasing the photodiode 205 and with isolating the output of the photodiode 205 from noise or interference associated with biasing circuitry (not shown) coupled to the input signal pad 201 or a power supply (not shown) coupled to the PIC 211 or the photonic device 200.

The photodiode 205 can be similar to or the same as the photodiode 113 described above in connection with FIG. 1. As shown in FIG. 2, and in embodiments, the photodiode 205 is coupled to the input signal pad 201 and an amplifier 207 disposed on an IC 215. In embodiments, the amplifier 207 is used to amplify a current output generated by the photodiode 205, where the amplification includes converting current output by the photodiode 205 into a voltage. In embodiments, the amplifier 207 is coupled to an output signal pad 213 to communicate the output of the amplifier 207 to an external component (e.g., a post-amplifier, etc.) that is not included within the photonic device 200. The amplifier 207 may be a TIA, any other suitable amplifier, or a combination of amplifiers known in the art. In embodiments, the I/O signal pad 201 is coupled to biasing circuitry (not shown) that is used to bias the photodiode 205. Additional details about the biasing circuitry are described below in connection with FIG. 4.

Figure 3A:
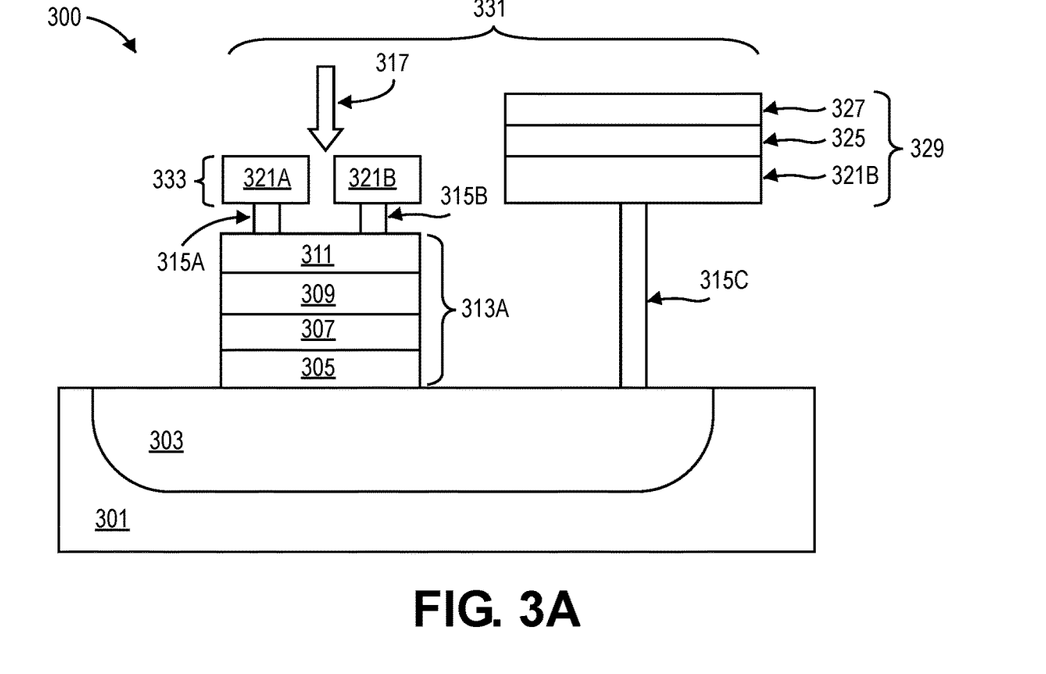
FIGS. 3A-3B provide cross sectional views of an example PIC with a photodiode and integrated bypass capacitor, in accordance with some embodiments.
Figure 3B:
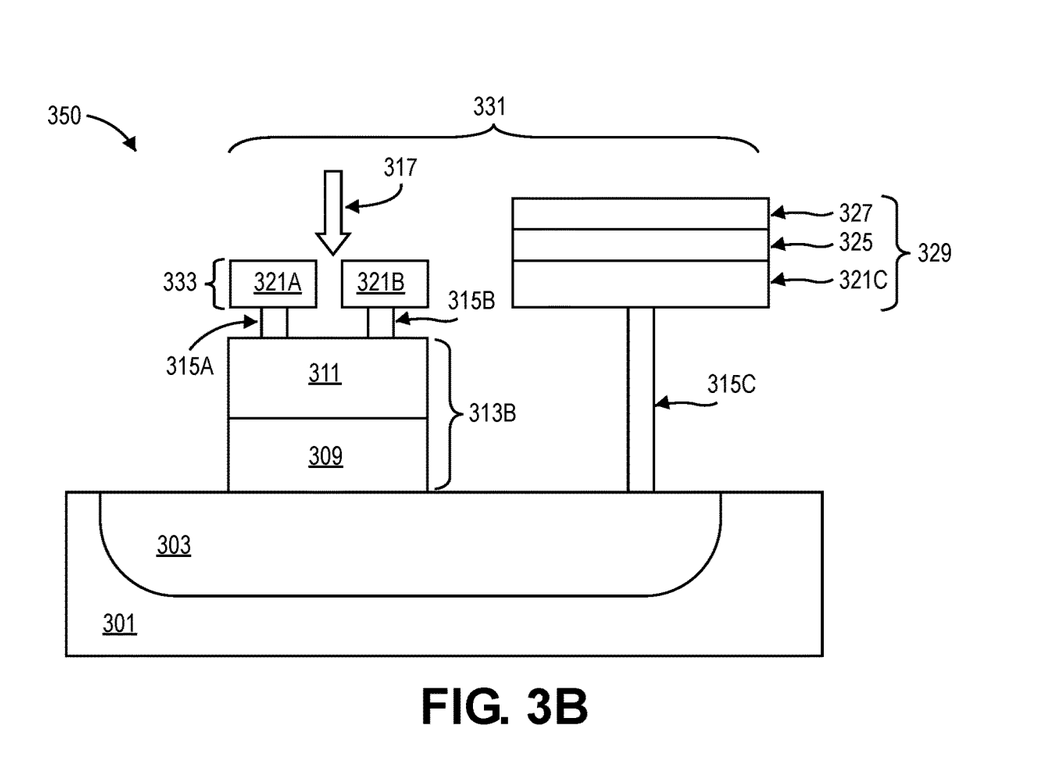

FIGS. 3A-3B provide cross sectional views of an example PIC with a photodiode and integrated bypass capacitor, in accordance with some embodiments. Each of the PICs 300 and 350 shown in FIGS. 3A-3B is integrated with a bypass capacitor and a photodiode in a channel. More specifically, the PIC 300 is integrated with a bypass capacitor 329 and an APD 313A in a channel 331, while the PIC 350 is integrated with a bypass capacitor 329 and a PIN photodiode 313B in a channel 331.

Referring now to FIG. 3A, the PIC 300 is shown. The PIC 300 comprises a substrate 301, which may be formed from one or more suitable materials known in the art (e.g., silicon, etc.). In embodiments, the substrate 301 comprises an N-contact layer 303 formed in or on the substrate 301 such that a surface of the N-contact layer 303 is exposed. Any suitable techniques known in the art for forming the substrate 301 with an N-contact layer 303 may be used. In embodiments, and as shown in FIG. 3A, an APD 313A is disposed on the N-contact layer 303. The APD 313A may be any suitable APD known in the art (e.g., a silicon APD, an indium phosphide based APD, a front illuminated APD, a back illuminated APD, etc.). With regard to the embodiment shown in FIG. 3A, the APD 313A comprises a separate absorption, charge, and multiplication (SACM) APD. For this embodiment, the APD 313A comprises a multiplication layer 305 on the N-contact layer 303, a charge layer 307 on the multiplication layer 305, an absorption layer 309 on the charge layer 307, and a P-contact layer 311 on the absorption layer 309. Furthermore, vias 315A-315C are disposed on the P-contact layer 311 and metallic structures 321A-321B are disposed on the vias 315A-315C, respectively. In embodiments, the metallic structures 321A-321C are formed from a metal layer 333 that is disposed on the vias 315A-315C. In embodiments, a light (optical power) 317 is impinged on the APD 313A. That is, the light 317 is illuminated on the P-contact layer 311, the vias 315, and the metallic structures 321. The APD 313A converts the light 317 into an output (e.g., a current, etc.).

In embodiments, a bypass capacitor 329 receives the output of the APD 313A to assist with biasing the APD 313A and with isolating the output of the APD 313A from noise or interference associated with other components associated with the PIC 300 (e.g., a biasing source (not shown) coupled to the PIC 300, a power supply (not shown) coupled to the PIC 300, etc.). In embodiments, the bypass capacitor 329 includes a dielectric material 325 disposed between two metallic structures 321C and 327. More specifically, the dielectric material 325 is disposed on and in contact with the metallic structure 321C and a metallic structure 327 is disposed on and in contact with the dielectric material 325. The dielectric material 325 can comprise a high k dielectric material. Each of the metallic structures 321A-321C can comprise electrical conductors, such as a conductive metal (e.g., copper, aluminum, etc.) or a combination of conductive metals.

In embodiments, and as shown in FIG. 3A, the bypass capacitor 329 is disposed on the via 315C. The N-contact layer 303 (which is in direct contact with the via 315C and the APD 313A) electrically couples the via 315C (which is coupled to the bypass capacitor 329) to the APD 313A. In this way, one or more signals can be communicated between the APD 313A and the bypass capacitor 329. In embodiments, the bypass capacitor 329 is a MIMCAP.

Referring now to FIG. 3B, the PIC 350 includes a PIN photodiode 313B instead of the APD 313A shown in FIG. 3A. The PIN photodiode 313B can be formed on the N-contact layer 303 using any suitable fabrication technique or combination of suitable fabrication techniques known in the art. In embodiments, the PIN photodiode 313B comprises an absorption layer 309 disposed on the N-contact layer 303 and a P-contact layer 311 disposed on the absorption layer 309. As shown, the PIN photodiode 313B differs from the APD 313A at least because the PIN photodiode 313B does not include a multiplication layer 305 and a charge layer 307 shown in the APD 313A.

Several advantages accrue from one or more of the embodiments described in reference to FIGS. 1-3B. One advantage is that the integration of a bypass capacitor into a PIC assists with providing flexibility in filter design. This is because the capacitance value of the bypass capacitor can be designed to satisfy the requirements of the application for which the bypass capacitor is being used. For example, the bypass capacitor can be designed to have a capacitance between 1 pF and 100 pF.

Another advantage is that the proximity of the bypass capacitor in a channel that spans the PIC and another IC to other electronic components (e.g., a photodiode, an I/O pad, ground pads, an amplifier, etc.) in the channel assists with creating short radio frequency (RF) return paths. These short RF return paths can assist with avoiding signal degradation during signal communication.

Another advantage is that integration of the bypass capacitor into a channel of a PIC ensures that a size of the bypass capacitor is less than a size of the channel. In this way, the size of a photonic device that includes the PIC may be decreased or prevented from increasing. Another benefit is that integration of the bypass capacitor into a channel of a PIC can assist with increasing the available real estate on a size-limited photonic device that includes the PIC. Yet another advantage is that the bypass capacitor is fabricated using existing metal layers and dielectrics that are available during the fabrication of the photodiode. Consequently, fabricating the bypass capacitor does not require inclusion of additional process steps or materials to state-of-the-art manufacturing processes, which can assist with preventing the costs of fabricating PICs or photonic devices from increasing.

As described above, photodiode (e.g., APD) performance (e.g., gain and bandwidth) can be dependent on an electronic device temperature. In addition, high intensity of optical input power to APD is often prohibited for APD-based receivers due to excessive current output beyond current overload specification of trans-impedance amplifiers, which, in turn, requires a variable optical attenuator (VOA) before APD.

The embodiments described herein provide for implementation of dynamic bias feedback look control based on readings of current output and device temperature in an electronic device with APD and bias capacitor integrated on the same PIC. The described embodiments provide a dynamic feedback loop control of APD bias on an electronic device (e.g., receiver) by feeding output current reading and temperature to a micro-controller unit that sets an APD bias level at a given time. An optical receiver provided in accordance with embodiments described herein can be self-sustaining and less prone to deployed environment. Such receiver technology benefits broad optical transceiver industries in general as a simpler way to deploy an APD-based receiver with large dynamic range for long-reach data transmission.

Figure 4:
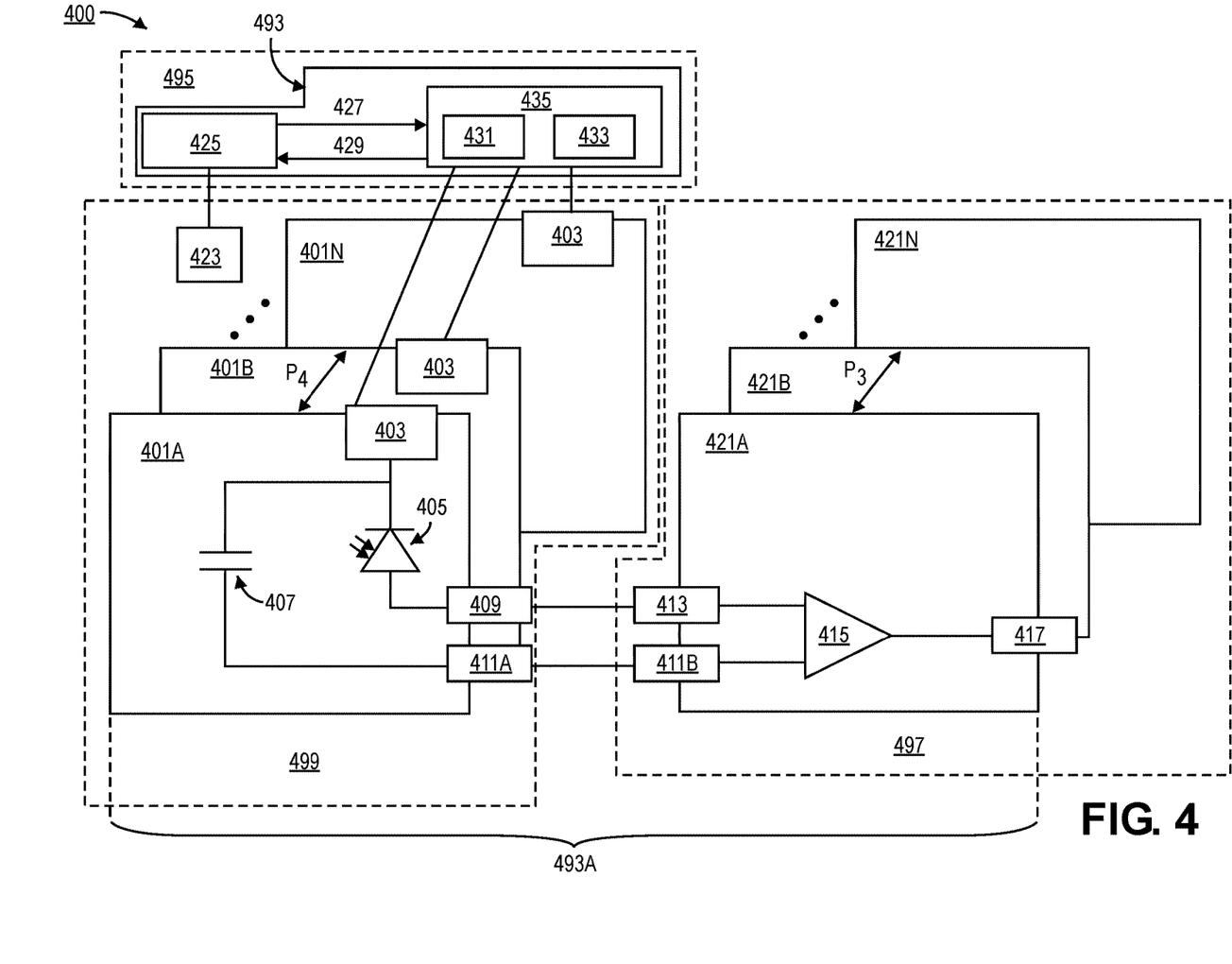
FIG. 4 is a block diagram of an example photonic device provided with dynamic bias feedback, in accordance with some embodiments.

FIG. 4 is a block diagram of an example photonic device provided with dynamic bias feedback, in accordance with some embodiments. In particular, FIG. 4 illustrates a photonic device 400 (e.g., an optical receiver, etc.) that includes a PIC 499 having multiple channels 401A-401N, an IC 497 having multiple channels 421A-421N, and an IC 495 that comprises biasing circuitry 493, according to some embodiments. It will be appreciated that the distribution of components among PIC 499, IC 497, and IC 495 described below is provided for purposes of description and is not limiting to the disclosure. For brevity, the description provided below in connection with FIG. 4 focuses on channels 401A and 421A. It is, however, to be appreciated that such description is applicable to channels 401B-401N and 421B-421N.

In embodiments, each of the channels 401A-401N can include one or more electronic components disposed thereon. For example, for channel 401A, the components include a photodiode 405, a bypass capacitor 407, an I/O signal pad 403, an output signal pad 409, and ground pad 411A disposed thereon. The photodiode 405 can be similar to or the same as any of the photodiodes described above in connection with any of FIGS. 1-3B, such as comprising an APD. The bypass capacitor 407 can be similar to or the same as any of the bypass capacitors described above in connection with one or more of FIGS. 1-3B. For example, the bypass capacitor 407 can be fabricated in an APD process flow by inserting a dielectric film between two metal layers. In embodiments, the bypass capacitor 407 can be a MIMCAP. As discussed above, the MIMCAP can assist with minimizing or eliminating the shortcomings of the SMT capacitor described above. For example, the MIMCAP has a relatively small form factor (when compared to the SMT capacitor) that enables disposing capacitor 407 in one of the channels 401A-401N.

As shown in FIG. 4, the photodiode 405 is coupled to the bypass capacitor 407, the output signal pad 409, and the I/O signal pad 403. Furthermore, the bypass capacitor 407 is coupled to the photodiode 405, the I/O signal pad 403, and the ground pad 411A. The I/O signal pad 403 couples the photodiode 405 and the bypass capacitor 407 to the IC 495 that comprises biasing circuitry 493. The output signal pad 409 couples an anode of the photodiode 405 to an input signal pad 413 disposed in the channel 421A. As described in further detail below, the input signal pad 413 is coupled to an amplifier 415 disposed in the channel 421A.

In embodiments, the PIC 499 also includes a temperature sensor 423 to sense a temperature of the PIC 499. In some embodiments, the temperature sensor 423 can be positioned adjacent the PIC 499 to sense the temperature of the PIC 499. The temperature sensor 423 may be a temperature sensing diode (e.g., a PN diode, a PIN diode, etc.), or any other suitable temperature sensor known to those having ordinary skill in the art.

In embodiments, the photonic device 400 also includes an IC 497 that comprises a plurality of channels 421A-421N. In embodiments, at least one of the channels 421A-421N has one or more electronic components disposed therein or thereon. The one or more electronic components may comprise an amplifier 415, a ground pad 411B, an input signal pad 413, and an output signal pad 417. In embodiments, the channel 421A comprises the amplifier 415, the ground pad 411B, the input signal pad 413, and the output signal pad 417. The amplifier 415 can be similar to or the same as any of the amplifier described above in connection with one or more of FIGS. 1-3B. As shown, the amplifier 415 is coupled to the input signal pad 413, the ground pad 411B, and the output signal pad 417. The input signal pad 413 is coupled to the output signal pad 409, which is described above. Consequently, signals can be communicated between the photodiode 405 and the amplifier 415. The output signal pad 417 is coupled to one or more electrical components (not shown) that are not part of the photonic device 400 so that the output of the amplifier 415 can be communicated to the off-device electrical component(s). For example, one or more current signals output by the photodiode 405 may be communicated via output signal pad 409 and input signal pad 413 to the amplifier 415. For this example, the amplifier 415 may process the current signals and convert them to one or more voltage signals that are output by the amplifier 415 and communicated (via the output signal pad 417) to one or more electronic components coupled to the photonic device 400.

As discussed above, the photodiode 405 may be sensitive to temperature changes. For example, the performance of the photodiode 405 may degrade as the temperature of the PIC 499 increases. Furthermore, a gain (e.g., direct current (DC) gain or noise gain, etc.) of the photodiode 405 may need to be lowered when the light (e.g., optical power, etc.) impinging on the photodiode 405 exceeds a threshold. Protecting the photodiode 405 from undesirable temperatures and noise gains can be achieved by adapting the bias voltage used for biasing the photodiode 405.

In embodiments, the photonic device 400 includes biasing circuitry 493 (in embodiments, disposed on IC 495) to adapt the bias voltage used for biasing the photodiode 405. In embodiments, the biasing circuitry 493 comprises a microcontroller (MCU) 425 and circuitry 435 that are coupled to each other. In embodiments, the circuitry 435 comprises a voltage regulator 431 and current mirror 433. In some embodiments, the voltage regulator 431 and the current mirror 433 could be included in a single apparatus, or could be distinct components disposed on or in the IC 495. In the described embodiments, each of the voltage regulator 431 and the current mirror 433 is coupled to the MCU 425.

In embodiments, the MCU is configured to receive data indicative of a sensed temperature of the PIC 499 from the temperature sensor 423 (which is located on, in, or adjacent the PIC 499), and receive 429 data indicative of a received signal strength indicator (RSSI) that can be determined by the current mirror 433. In embodiments, the RSSI can be determined individually for each of the channels 401A-401N. For example, the RSSI associated with the channel 401A is determined separately from any of the RSSIs associated with the remaining channels 401B-401N. For channel 401A, the RSSI can be determined by the current mirror 433 based on replication of the current flowing through the photodiode 405 that is disposed on the PIC 499.

In embodiments, the MCU 425 is configured to receive data from the temperature sensor 423 and the current mirror 433, and process the received data to determine a bias voltage VSET for biasing the photodiode 405. In embodiments, the MCU 425 may store multiple values of a bias voltage in the form of a lookup table (LUT) in an internal memory of the MCU. The LUT may be configured, in advance, through testing of the photodiode 405 using different ambient temperatures and RSSIs associated with the photodiode 405 to determine multiple values of the bias voltage VSET. Following the determination of the appropriate bias voltage, the MCU 425 is configured to communicate 427 data indicative of the determined magnitude of the bias voltage VSET to the voltage regulator 431. The voltage regulator 431 is provided to bias the photodiode 405 using a bias voltage having the determined magnitude. The voltage regulator 431 may comprise a linear voltage regulator, a switching voltage regulator, or any other voltage regulator known to those having ordinary skill in the art.

As noted above, each of the PIC 499 and the IC 497 may include any number of channels. Furthermore, the number of channels 401A-401N may differ from or be equal to the number of channels 421A-421N. In embodiments, the number of channels 401A-401N of the PIC 499 is the same as the number of channels 421A-421N of the IC 497 so that the photonic device 400 has an equal amount of data channels. Determining the appropriate number of data channels is performed by determining the number of channels 421A-421N that can reside on the IC 497. In embodiments, the number of channels 421A-421N on the IC 497 is constrained by a predetermined channel-to-channel pitch $P_3$. For example, the channel-to-channel pitch $P_3$ and the number of channels 421A-421N may be set in advance by a manufacturer of the IC 497. In embodiments. the channel-to-channel pitch $P_3$ is 250 µm or less.

After the channel-to-channel pitch $P_3$ is determined, a channel-to-channel pitch $P_4$ between adjacent channels selected from the channels 401A-401N of the PIC 499 is determined. In embodiments, the channel-to-channel pitch $P_4$ is equal to the channel-to-channel pitch $P_3$. In this way, the photonic device 400 has an equal number of data channels.

In embodiments, each channel 401A-401N can be coupled to a respective one of the channels 421A-421N to form a data channel that spans the PIC 499 and the IC 497. In this way, one or more electronic components disposed in each of the channels 401A-401N are coupled to one or more electronic components disposed in a respective one of the channels 421A-421N. For example, and as shown in FIG. 4, the channel 401A is coupled to channel 421A to form a data channel 493A that spans the PIC 499 and the IC 497. Consequently, and for this example, one or more electronic components disposed in or on the channel 401A are coupled to one or more electronic components disposed in or on the channel 421A. For a more specific example, the output signal pad 409 (which is disposed in the channel 401A of the PIC 499) is coupled to the input signal pad 413 (which is disposed on or in the channel 421A of the IC 497) and the ground pad 411A (which is disposed in the channel 401A of the PIC 499) is coupled to the ground pad 411B (which is disposed on or in the channel 421A of the IC 497).

Stated differently, in the data channel 493A, the output signal pad 409 is coupled to the input signal pad 413 and the ground pad 411A is coupled to the ground pad 411B. Consequently, the photodiode 405 is coupled to the amplifier 415 via signal pads 409 and 413 and the bypass capacitor 407 is coupled to the amplifier 415 via ground pads 411A-411B. Even though reference is only made to the channel 493A, it is to be appreciated that each of the channels 401B-401N is coupled to a respective one of the channels 421A-421N to form a data channel.

In summary, the described embodiments provide for a dynamic feedback loop control of APD bias on the photodiode 405 by feeding output current reading and temperature to the MCU 425, which is configured to dynamically set an APD bias level at a given time, depending on the photodiode current output and the temperature reading associated with the PIC 499.

The described embodiments provide for a number of advantages compared to conventional solutions. For example, in embodiments, the ground pads 411A of bypass capacitor 407 can be disposed in proximity to the ground pad 411B, to ensure a short RF return path. In addition, bypass capacitor 407 size is restricted by TIA channel pitch for multi-channel application described herein, whereas typical SMT capacitor may not be implemented due to large footprint and long RF return path. Further, as noted above, the capacitor 407 (MIMCAP) can be produced of existing metal layers and dielectrics of APD or PIN fabrication process flow. This provides flexibility in filter design, e.g., capacitance value of MIMCAP. Also, the MIMCAP layout can ensure a short RF return path and match TIA channel pitch.

Figure 5:
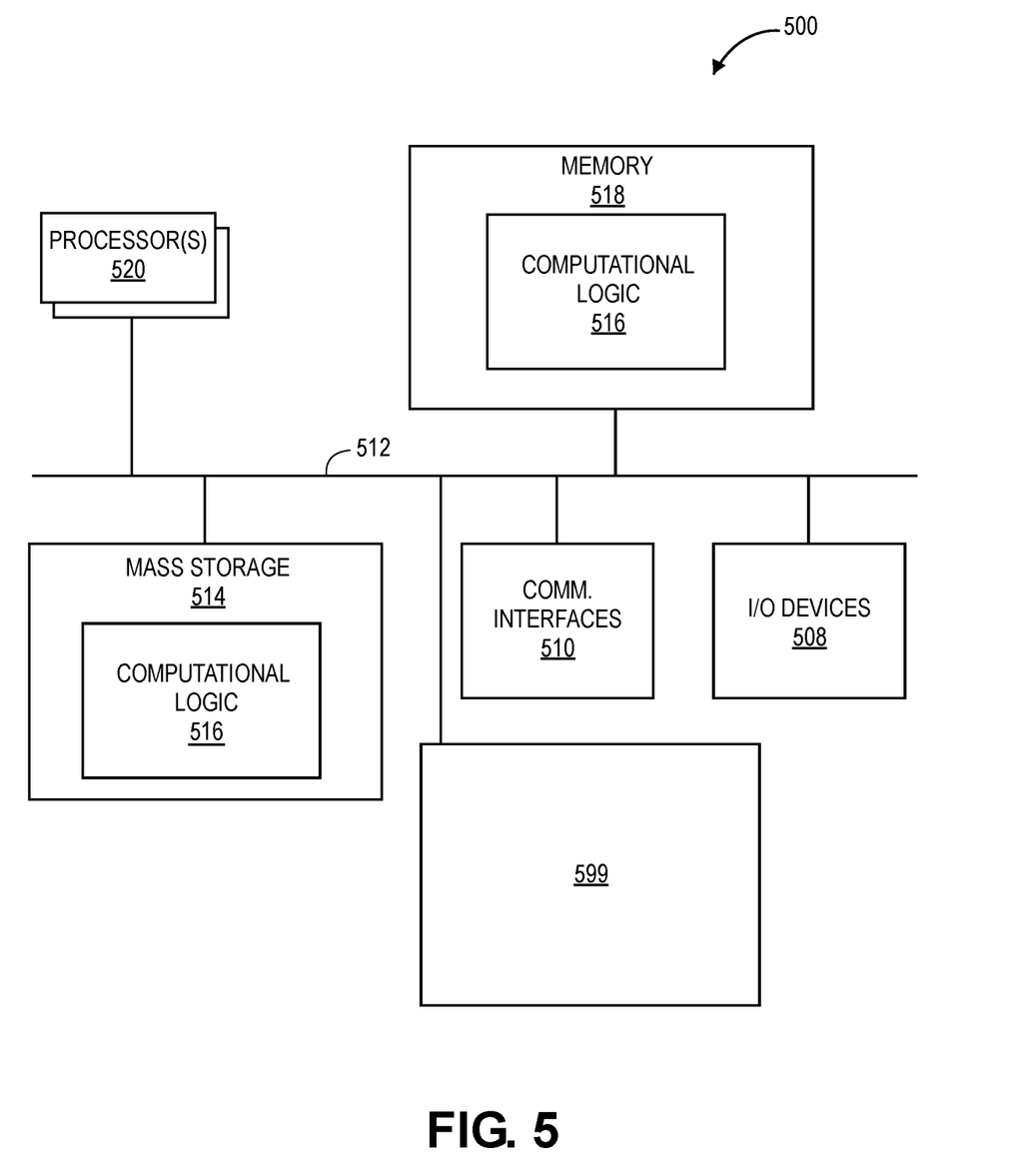
FIG. 5 illustrates an example computing device suitable for use with various components described in connection with one or more of FIGS. 1-4, in accordance with some embodiments.

FIG. 5 illustrates an example computing device 500 suitable for use with various components described in connection with one or more of FIGS. 1-4, such as a PIC 100 comprising multiple channels 103A-103N that each have a bypass capacitor 115 and a photodiode 113 disposed therein, in accordance with various embodiments.

As shown, computing device 500 may include one or more processors or processor cores 520 and system memory 518. For the purpose of this application, the terms "processor" and "processor cores" may be considered synonymous, unless the context clearly requires otherwise. The processor 520 may include any type of processors, such as a central processing unit (CPU), a microprocessor, and the like. The processor 520 may be implemented as an integrated circuit having multi-cores, e.g., a multi-core microprocessor.

The computing device 500 may include mass storage devices 514 (such as diskette, hard drive, volatile memory (e.g., dynamic random-access memory (DRAM), compact disc read-only memory (CD-ROM), digital versatile disk (DVD), and so forth). In general, system memory 518 and/or mass storage devices 514 may be temporal and/or persistent storage of any type, including, but not limited to, volatile and non-volatile memory, optical, magnetic, and/or solid state mass storage, and so forth. Volatile memory may include, but is not limited to, static and/or dynamic random-access memory. Non-volatile memory may include, but is not limited to, electrically erasable programmable read-only memory, phase change memory, resistive memory, and so forth.

The computing device 500 may further include I/O devices 508 (such as a display (e.g., a touchscreen display), keyboard, cursor control, remote control, gaming controller, image capture device, and so forth) and communication interfaces 510 (such as network interface cards, modems, infrared receivers, radio receivers (e.g., Bluetooth), and so forth). In some embodiments, the communication interfaces 510 may include or otherwise be coupled with apparatus 599 (e.g., an optical receiver, etc.) that includes a photonic IC with bypass capacitors and photodiodes integrated therein, as described herein.

In general, the computing device 500 may include or otherwise be associated with an optoelectronic system, such as apparatus (e.g., photonic device) 599 implementing aspects of a PIC comprising multiple channels that each have a bypass capacitor and a photodiode disposed therein, as described above. In some embodiments, at least some components of the photonic device 599 may be communicatively coupled with the computing device 500 and/or be included in one or more of the computing device 500's components, such as communication interfaces 510, for example.

The communication interfaces 510 may include communication chips (not shown) that may be configured to operate the computing device 500 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 510 may operate in accordance with other wireless protocols in other embodiments.

The above-described computing device 500's elements may be coupled to each other via system bus 512, which may represent one or more buses. In the case of multiple buses, they may be bridged by one or more bus bridges (not shown). Each of these elements may perform its conventional functions known in the art. In particular, system memory 518 and mass storage devices 514 may be employed to store a working copy and a permanent copy of the programming instructions for the operation of any one of the photonic ICs or photonic devices described above in connection with one or more of FIGS. 1-4. The various elements may be implemented by assembler instructions supported by processor(s) 520 or high-level languages that may be compiled into such instructions.

The permanent copy of the programming instructions may be placed into mass storage devices 514 in the factory, or in the field through, for example, a distribution medium (not shown), such as a compact disc (CD), or through communication interface 510 (from a distribution server (not shown)). That is, one or more distribution media having an implementation of the agent program may be employed to distribute the agent and to program various computing devices.

The number, capability, and/or capacity of the elements 508, 510, 512 may vary, depending on whether computing device 500 is used as a stationary computing device, such as a set-top box or desktop computer, or a mobile computing device, such as a tablet computing device, laptop computer, game console, or smartphone. Their constitutions are otherwise known, and accordingly cannot be further described.

In embodiments, memory 518 may include computational logic 516 configured to practice aspects of embodiments, such as operation of the PIC 100, as described above in connection with one or more of FIGS. 1-5. In embodiments, at least one of processors 520 may be packaged together with computational logic 516 configured to practice aspects of optical signal transmission and receipt described herein to form a System in Package (SiP) or a System on Chip (SoC).

In various implementations, the computing device 500 may comprise one or more components of a data center, a laptop, a netbook, a notebook, an ultrabook, a smartphone, a tablet, a personal digital assistant (PDA), an ultra-mobile PC, a mobile phone, or a digital camera. In further implementations, the computing device 500 may be any other electronic device that processes data.

According to various embodiments, the present disclosure describes a number of examples.

Example 1 is an apparatus, comprising: a substrate in which at least first and second channels are formed, wherein the first channel includes a first photodiode and a first capacitor coupled to the first photodiode, and the second channel includes a second photodiode and a second capacitor coupled with the second photodiode, wherein the first and second capacitors are provided to assist with biasing the first and second photodiodes respectively and to isolate a signal output by the first and second photodiodes from interference provided by a power supply associated with the apparatus.

Example 2 includes the subject matter of Example 1, wherein each of the first capacitor and the second capacitor comprises a high k dielectric material disposed between two metallic materials.

Example 3 includes the subject matter of Example 2, wherein one or more of the first capacitor and the second capacitor is a metal-insulator-metal capacitor (MIMCAP).

Example 4 includes the subject matter of Example 1, wherein the first and second photodiodes comprise an avalanche photodiode (APD) or a PIN photodiode.

Example 5 includes the subject matter of Example 1, wherein a size of the first capacitor is less than or equal to a size of the first channel and wherein a size of the second capacitor is less than or equal to a size of the second channel.

Example 6 includes the subject matter of Example 1, wherein a ground pad coupled to the first capacitor is adjacent a ground pad coupled to a first amplifier that is coupled to the first photodiode and wherein a ground pad coupled to the second capacitor is adjacent a ground pad coupled to a second amplifier that is coupled to the second photodiode.

Example 7 includes the subject matter of Example 1, wherein the apparatus comprises a photonic integrated circuit (PIC).

Example 8 includes the subject matter of any of Examples 1 to 7, further comprising a temperature sensor, to sense a temperature of the apparatus, and provide readings of the temperature to another apparatus for processing.

Example 9 is a system, comprising: a first electronic device that includes a photodiode, a capacitor coupled to the photodiode and disposed in the channel, to assist with biasing the photodiode, and a temperature sensor, to sense a temperature of the first electronic device; and a second electronic device that includes a microcontroller, wherein the microcontroller is to adjust a bias voltage of the photodiode, based at least in part on temperature readings provided by the temperature sensor of the first electronic device.

Example 10 includes the subject matter of Example 9, wherein the microcontroller is to receive readings of the temperature provided by the temperature sensor.

Example 11 includes the subject matter of Example 9, wherein the second electronic device further includes a biasing circuitry coupled with the microcontroller, to receive a current output from the photodiode, and provide the current output to the microcontroller for processing, wherein the bias voltage adjustment is further based at least in part on the current output of the photodiode.

Example 12 includes the subject matter of Example 11, wherein the biasing circuitry includes a voltage regulator and a current mirror coupled with the voltage regulator, to replicate the current output.

Example 13 includes the subject matter of Example 9, wherein the capacitor comprises a metal-insulator-metal capacitor (MIMCAP).

Example 14 includes the subject matter of Example 13, wherein the photodiode is an avalanche photodiode (APD) or a PIN photodiode.

Example 15 includes the subject matter of Example 14, wherein the photodiode and the capacitor are disposed in a channel formed in the first electronic device, wherein the first electronic device comprises a photonic integrated circuit (PIC).

Example 16 includes the subject matter of any of Examples 9 to 15, wherein the temperature sensor is coupled to the microcontroller, to provide the temperature readings to the microcontroller.

Example 17 is a computing device, comprising: a processor; and a receiver coupled with the processor, wherein the receiver includes at least first and second channels, wherein the first channel includes a first photodiode and a first capacitor coupled to the first photodiode, and the second channel includes a second photodiode and a second capacitor coupled with the second photodiode, wherein the first and second capacitors are provided to assist with biasing the first and second photodiodes respectively and to isolate a signal output by the first and second photodiodes from interference provided by a power supply associated with the receiver.

Example 18 includes the subject matter of Example claim 17, wherein the first capacitor and the second capacitor comprise a metal-insulator-metal capacitor (MIMCAP).

Example 19 includes the subject matter of Example 17, wherein the first and second photodiodes comprise an avalanche photodiode (APD) or a PIN photodiode.

Example 20 includes the subject matter of any of Examples 17 to 19, wherein a size of the first capacitor is less than or equal to a size of the first channel and wherein a size of the second capacitor is less than or equal to a size of the second channel.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

The invention claimed is:

1. An apparatus, comprising a photonic integrated circuit (PIC), wherein the PIC includes:
   a substrate in which at least first and second channels of the PIC are formed adjacent to each other, wherein a channel-to-channel pitch between the first and second channels is equal to a pitch between corresponding adjacent first and second channels on an integrated circuit (IC), wherein the PIC and the IC are to be coupled to form a resulting data channel, wherein the first channel formed on the PIC is to be coupled to the corresponding first channel on the IC, and the second channel formed on the PIC is to be coupled to the corresponding second channel on the IC,
   wherein the first channel includes a first photodiode and a first capacitor coupled to the first photodiode, and the second channel includes a second photodiode and a second capacitor coupled with the second photodiode,
   wherein the first photodiode and the first capacitor have respective first and second sizes that are less than a first size of the first channel of the PIC, in order for the first channel to accommodate the first photodiode and the first capacitor, and wherein the second photodiode and the second capacitor have respective third and fourth sizes that are less than a second size of the second channel of the PIC, in order for the second channel to accommodate the second photodiode and the second capacitor,
   wherein the first and second capacitors are provided to assist with biasing the first and second photodiodes respectively and to isolate a signal output by the first and second photodiodes from interference provided by a power supply associated with the apparatus.

2. The apparatus of claim 1, wherein each of the first capacitor and the second capacitor comprises a high k dielectric material disposed between two metallic materials.

3. The apparatus of claim 2, wherein one or more of the first capacitor and the second capacitor is a metal-insulator-metal capacitor (MIMCAP).

4. The apparatus of claim 1, wherein the first and second photodiodes comprise an avalanche photodiode (APD) or a PIN photodiode.

5. The apparatus of claim 1, wherein a ground pad coupled to the first capacitor is adjacent a ground pad coupled to a first amplifier that is coupled to the first photodiode and wherein a ground pad coupled to the second capacitor is adjacent a ground pad coupled to a second amplifier that is coupled to the second photodiode.

6. The apparatus of claim 1, further comprising a temperature sensor, to sense a temperature of the apparatus, and provide readings of the temperature to another apparatus for processing.

7. A system, comprising:
   a first electronic device that includes: a first photodiode, a first capacitor coupled to the first photodiode and disposed in a first channel formed in the first electronic device, to assist with biasing the first photodiode, a second photodiode, a second capacitor coupled to the a second photodiode and disposed in a second channel formed in the first electronic device, to assist with biasing the second photodiode, wherein the first and second channels of the PIC are formed adjacent to each other, wherein a channel-to-channel pitch between the first and second channels is equal to a pitch between corresponding adjacent first and second channels on an integrated circuit (IC), wherein the first electronic device and the IC are to be coupled to form a resulting data channel, wherein the first channel formed on the first electronic device is to be coupled to the corresponding first channel on the IC, and the second channel formed on the first electronic device is to be coupled to the corresponding second channel on the IC, wherein the first photodiode and the first capacitor have respective first and second sizes that are less than a first size of the first channel, in order for the first channel to accommodate the first photodiode and the first capacitor, and wherein the second photodiode and the second capacitor have respective third and fourth sizes that are less than a second size of the second channel, in order for the second channel to accommodate the second photodiode and the second capacitor, and wherein the first electronic device further includes a temperature sensor, to sense a temperature of the first electronic device; and
   a second electronic device that includes a microcontroller, wherein the microcontroller is to adjust a bias voltage of the photodiode, based at least in part on temperature readings provided by the temperature sensor of the first electronic device.

8. The system of claim 7, wherein the microcontroller is to receive readings of the temperature provided by the temperature sensor.

9. The system of claim 7, wherein the second electronic device further includes a biasing circuitry coupled with the microcontroller, to receive a current output from the first photodiode, and provide the current output to the microcontroller for processing, wherein the bias voltage adjustment is further based at least in part on the current output of the first photodiode.

10. The system of claim 9, wherein the biasing circuitry includes a voltage regulator and a current mirror coupled with the voltage regulator, to replicate the current output.

11. The system of claim 7, wherein the first capacitor comprises a metal-insulator-metal capacitor (MIMCAP).

12. The system of claim 11, wherein the first photodiode is an avalanche photodiode (APD) or a PIN photodiode.

13. The system of claim 12, wherein the first electronic device comprises a photonic integrated circuit (PIC).

14. The system of claim 7, wherein the temperature sensor is coupled to the microcontroller, to provide the temperature readings to the microcontroller.

15. A computing device, comprising:
a processor; and
a receiver coupled with the processor, wherein the receiver includes at least first and second channels that are formed adjacent to each other in a photonic integrated circuit (PIC) that includes the receiver, wherein a channel-to-channel pitch between the first and second channels is equal to a pitch between corresponding adjacent first and second channels on an integrated circuit (IC), wherein the PIC and the IC are to be coupled to form a resulting data channel, wherein the first channel formed on the PIC is to be coupled to the corresponding first channel on the IC, and the second channel formed on the PIC is to be coupled to the corresponding second channel on the IC, wherein the first channel includes a first photodiode and a first capacitor coupled to the first photodiode, and the second channel includes a second photodiode and a second capacitor coupled with the second photodiode, wherein the first photodiode and the first capacitor have respective first and second sizes that are less than a first size of the first channel of the PIC, in order for the first channel to accommodate the first photodiode and the first capacitor, and wherein the second photodiode and the second capacitor have respective third and fourth sizes that are less than a second size of the second channel of the PIC, in order for the second channel to accommodate the second photodiode and the second capacitor,
wherein the first and second capacitors are provided to assist with biasing the first and second photodiodes respectively and to isolate a signal output by the first and second photodiodes from interference provided by a power supply associated with the receiver.

16. The computing device of claim 15, wherein the first capacitor and the second capacitor comprise a metal-insulator-metal capacitor (MIMCAP).

17. The computing device of claim 15, wherein the first and second photodiodes comprise an avalanche photodiode (APD) or a PIN photodiode.

* * * * *

UNITED STATES PATENT AND TRADEMARK OFFICE
CERTIFICATE OF CORRECTION

| | | |
|---|---|---|
| PATENT NO. | : 11,029,205 B2 | Page 1 of 1 |
| APPLICATION NO. | : 16/513457 | |
| DATED | : June 8, 2021 | |
| INVENTOR(S) | : Sungbong Park and Ansheng Liu | |

It is certified that error appears in the above-identified patent and that said Letters Patent is hereby corrected as shown below:

In the Claims

Column 16
Line 36, Claim 7, "... the a" should read -- ... the --

Signed and Sealed this
Twenty-first Day of February, 2023

Katherine Kelly Vidal
*Director of the United States Patent and Trademark Office*